United States Patent [19]

de Cremoux

[11] 4,173,764

[45] Nov. 6, 1979

[54] FIELD EFFECT TRANSISTOR ON A SUPPORT HAVING A WIDE FORBIDDEN BAND

[75] Inventor: Baudouin de Cremoux, Paris, France

[73] Assignee: Thomson-CSF, Paris, France

[21] Appl. No.: 893,534

[22] Filed: Apr. 4, 1978

[30] Foreign Application Priority Data

Apr. 8, 1977 [FR] France .............................. 77 10754

[51] Int. Cl.² ......................................... H01L 29/80
[52] U.S. Cl. ................................... 357/22; 357/16; 357/15; 357/61
[58] Field of Search .................... 357/16, 22, 4, 61, 15

[56] References Cited

U.S. PATENT DOCUMENTS

| | | | |
|---|---|---|---|
| 3,217,214 | 11/1965 | Tummers | 317/235 |
| 3,273,030 | 9/1966 | Balk | 317/235 |
| 3,767,984 | 10/1973 | Shinoda | 317/235 R |
| 4,075,651 | 2/1978 | James | 357/22 |
| 4,075,652 | 2/1978 | Umebachi | 357/22 |

*Primary Examiner*—Martin H. Edlow
*Attorney, Agent, or Firm*—Cushman, Darby & Cushman

[57] ABSTRACT

A field effect transistor deposited upon a substrate having a wide forbidden band comprises an active layer of n-type conductivity which forms a heterojunction with the substrate. Since the subjacent material has a forbidden band higher than the forbidden band of the active layer, the formation of electronic currents between the source and the drain and in the substrate is avoided.

9 Claims, 5 Drawing Figures

FIELD EFFECT TRANSISTOR ON A SUPPORT HAVING A WIDE FORBIDDEN BAND

This invention relates to a field effect transistor on a substrate having a wide forbidden band.

It is known in the art how to produce field effect transistors comprising a semi-insulating substrate of gallium arsenide (Ga As). A so-called "active" layer also of gallium arsenide having n-type conductivity, a doping concentration of the order of $10^{17}$ at/cc and a minimal thickness of the order of 0.1 to 1 μm, is deposited onto this substrate by epitaxy or by any other method. The conduction channel is intended to form in this layer. On the surface of this layer are deposited, on the one hand, the two source and drain electrodes which are respectively metallic deposits providing ohmic contacts with the active layer. Between the two electrodes is deposited the so-called "gate" electrode made of a metal forming a rectifying contact with the layer (so-called "Schottky" contact).

These transistors, which are commonly known as "MESFET" transistors (Metal Semiconductor Field Effect Transistors) are highly advantageous for microwave applications. Nevertheless, they are attended by several disadvantages. In particular, when the voltage applied to the gate is sufficient to "pinch" or block the transistor, electronic currents are able to form between the source and the drain through the substrate.

These electronic currents reduce the low-level gain and the drain-source resistance in the saturated region of the characteristics.

In addition, since these transistors are generally produced by a thermal treatment (epitaxy in the vapour phase), they can have other defects due to the presence of traps situated in the vicinity of the substrate/epitaxial layer interface.

These faults are primarily a gradual drift in their characteristics as a function of time, the hysteresis of these characteristics (formation of loops in the characteristics $I_d = f(V_{ds})$) and noise.

Although several solutions have been proposed with a view to obviate this situation, these solutions generally do not eliminate the first category of defects referred to above. The present invention relates to a transistor of the type described above in which these defects are eliminated.

The field effect junction transistor according to the invention is of the type comprising a semi-insulating substrate, on which a very thin layer of n-type conductivity is deposited by epitaxy, and further comprising on this layer ohmic source and drain contacts and a Schottky type contact for the gate.

It is essentially characterised in that the active layer is deposited on a material having a forbidden band gap higher than its own forbidden band, the difference in height between these respective bands preventing the electrons from leaving the active zone as a result of the formation of a potential barrier.

The invention will be better understood from the following description in conjunction with the accompanying drawings, wherein.

Figure 1:
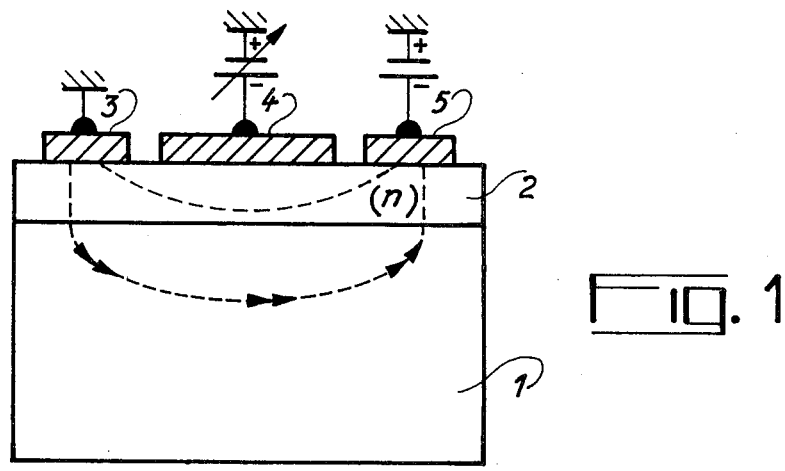
FIG. 1 is a cross-section through a known type of field effect transistor.

FIG. 1 is a transverse section of the field effect transistor of the prior art "MESFET" type. This transistor comprises a substrate 1 of the semi-insulating type, its resistivity being of the order of $10^7$ ohms.cm. An active layer 2 of n-type GaAs having an impurity concentration of the order of $10^{17}$ at/cc is deposited on the layer 1 by epitaxy, for example liquid or vapour phase epitaxy. The thickness of the active layer 2 is, for example and solely for the purposes of illustration, of the order of 0.3 μm.

Figure 2:
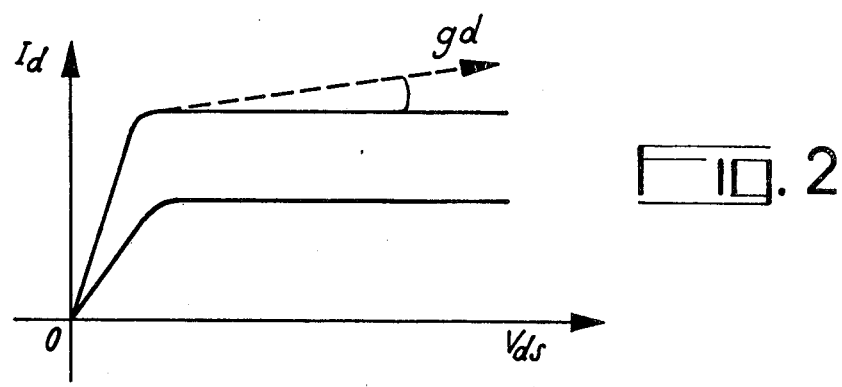
FIG. 2 shows a set of explanatory curves.

The source, gate and drain electrodes 3, 4 and 5 are deposited on the free surface of the active layer 2. These electrodes are three metallic contacts; the two contacts 3 and 5 are of the same type and are purely ohmic. In other words, they form with the GaAs, at the interface, compounds which ensure transmission of the charge carriers. The gate electrode 4 forms with the GaAs a contact of the Schottky type, i.e. of the rectifier type. In other words, when the zero potential is applied to the source, a constant positive potential to the drain and a negative potential to the gate, the gate will have a tendency to repel the free n-type carriers, to "pinch" the layer 2 by the appearance of a space charge phenomenon and, hence, to cause the source-drain current to vary. The space charge zone only comprises positive fixed charges which do not ensure the passage of the electronic current from the source towards the drain. This results in the saturation of the drain-source resistance, as shown in FIG. 2. As mentioned earlier on, known transistors of this type are attended by a disadvantage: when the channel is "pinched", electronic currents are able to form from the source to the drain through the semi-insulating substrate. These currents are symbolised by the circuit shown in dotted lines and with a double arrow in FIG. 1. As shown in FIG. 2, their effect is to impart a slope $g_d$ to the saturated part of the characteristic, which reduces the gain of the transistor.

Figure 3:
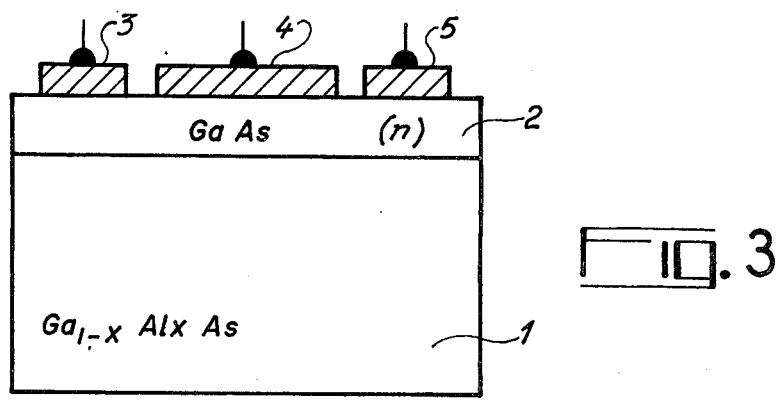
FIGS. 3, 4 and 5 are cross-sections through three embodiments of the invention.

The structure shown in FIG. 3 represents a first example of embodiment of the structure according to the invention which enables this first disadvantage to be obviated.

In FIG. 3, the layer 2 is made of a material different from that forming the substrate. It has substantially the same dimensions and the same doping concentration as in FIG. 1. However, the material has a lower forbidden band than the substrate, resulting in the formation of a potential barrier which avoids the passage of electrons from the active layer into the substrate.

The invention may be put into effect particularly readily in cases where the semiconductors used are based on gallium arsenide, because it is known that compounds having the formula $Ga_{1-x}Al_xAs$ have a forbidden band higher than that of gallium arsenide.

In the context of the invention, the height of the forbidden band is higher than that of gallium arsenide.

In the context of the invention, the height of the forbidden band is understood to be the difference in the energy levels in a semiconductor between the valence band and the conduction band.

The method of production may be as follows: GaAs may be deposited on the substrate by vapour-phase epitaxy or by molecular jet epitaxy. The substrate has itself been obtained by conventional epitaxial techniques. The contacts are deposited by the conventional methods of vacuum evaporation and photolithography.

Figure 4:
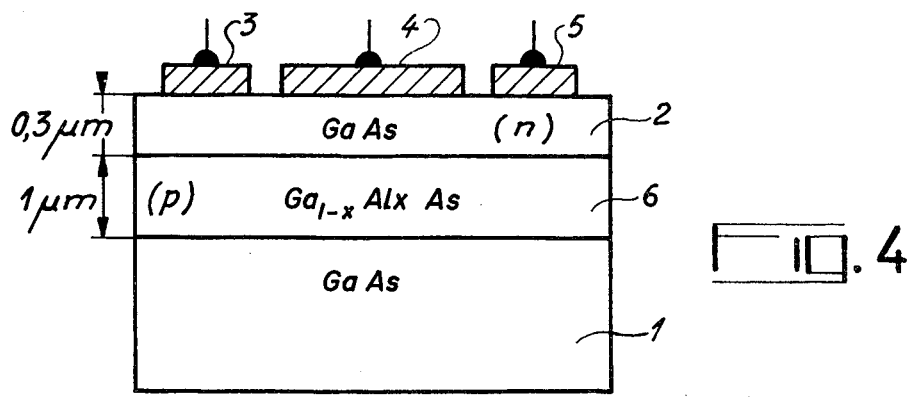

FIG. 4 shows a second more elaborate example of embodiment in which the presence of traps at the active layer substrate interface may be avoided.

This structure is distinguished from the preceding structure by the presence of a buffer layer 6 inserted between the layers 1 and 2. In this case, the substrate is made of gallium arsenide, as is the active layer 2. The buffer layer 6 is made of a material having a forbidden band of greater height than the active layer. Its thickness is of the order of 1 to 10 μm. Its composition has the following formula:

$$Ga_{1-x}Al_xAs$$

where x may be of the order of 0.5, i.e. between 0.4 and 0.6.

The mode of production may be for example as follows:

A multiple-bath crucible for liquid-phase epitaxy is used. The liquid baths are saturated at 800° C. and the temperature reduction rate is of the order of 0.2° C. per minute.

In one example of embodiment, the buffer layer 6 is obtained by means of above having the following composition in atomic fractions:

| Ga | Al | As | Ge |
|---|---|---|---|
| 0.9825 | $4.10^{-3}$ | $13.10^{-2}$ | $5.10^{-4}$ |

The substrate is introduced into this bath heated to a temperature of 799° C., the growth being 10 minutes.

The composition of the buffer layer is as follows:

$$Ga_{0.5} \; Al_{0.5} \; As$$

whilst its doping is of p-type with a concentration below $10^{15}$ at/cc and its thickness is 1 μm.

The assembly is then placed in another bath having the following composition in atomic fractions:

| Ga | As | Sn |
|---|---|---|
| 0.958 | $2.21.10^{-2}$ | $2.10^{-2}$ |

The growth time of the active layer is 15 seconds. Its composition has the formula GaAs, its n-type doping is of the order of $10^{17}$ at/cc and its thickness is 0.3 μm.

The buffer layer forms with the active layer the heterojunction required for obtaining an discontinuity in the forbidden band. It avoids the formation of traps at the active layer/substrate interface.

It should be pointed out that other methods of production may be used. The method described above has the advantage that it does not necessitate any heat treatments at temperatures above 800° C.

It should also be pointed out that compounds other than GaAs may be used. GaAs has the advantage of being able to be readily obtained by liquid-phase epitaxy. In addition, by adding aluminium, it is possible readily to obtain on the one hand good heterojunctions and, on the other hand, materials having greater forbidden band heights than GaAs.

In accordance with the invention, therefore, it has been possible on the one hand to obtain heterojunction discontinuities in forbidden bands which prevent the propagation of electronic currents into the substrate, and, on the other hand, by the addition of a buffer layer, to avoid the formation of interfacial traps.

Figure 5:
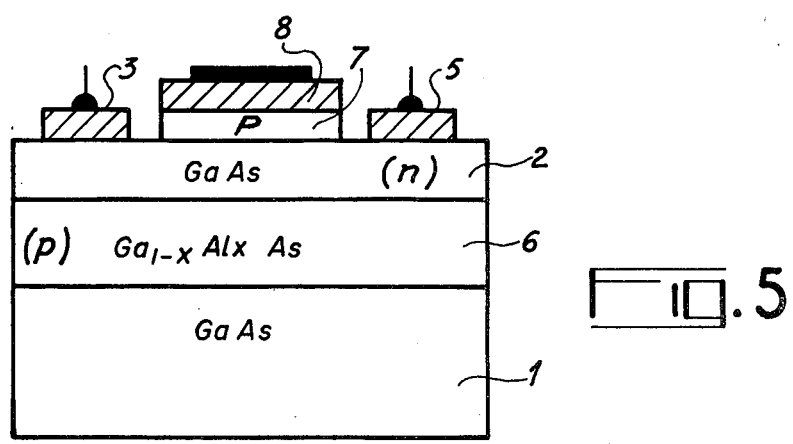

The invention is by no means limited to the use of a Schottky group. FIG. 5 shows a structure identical with that of FIG. 4 in which the gate 7 is made of a p-type semiconductor and which supports an ohmic contact 8. All the conductivity types may of course be inverted.

What I claim is:

1. A field effect transistor comprising:
   a substrate layer;
   an active semiconducting layer deposited on said substrate layer, and
   three electrodes disposed on the surface of said active layer respectively forming source, gate and drain electrodes, the gate electrode forming a rectifying junction with said active layer, and said active layer forming a heterojunction with said substrate layer, said substrate layer being made of a semiconductor material having a higher forbidden energy band gap than that of said active layer.

2. A transistor as claimed in claim 1, wherein said substrate is semi-insulating.

3. A transistor as claimed in claim 1, wherein said gate is made of a metal which forms a rectifying contact with said active layer.

4. A transistor as claimed in claim 1, wherein said gate is formed by a semiconducting layer which forms a rectifying junction with said active layer.

5. A transistor according to claim 1, wherein said active layer is made of gallium arsenide and the substrate layer is made of a compound having the formula $Ga_{1-x}Al_xAs$.

6. A field effect transistor comprising:
   a semiconductor substrate layer;
   a buffer semiconductor layer deposited on the surface of said substrate layer;
   an active semiconductor layer deposited on the surface of said buffer layer; and
   three electrodes disposed on the surface of said active layer respectively forming source, gate and drain electrodes, the gate electrode forming a reactifying junction with said active layer, and said active layer forming a heterojunction with said buffer layer, said buffer layer being made of a material having a higher forbidden energy band gap than said active layer.

7. A transistor according to claim 6 wherein said substrate is a semi-insulating layer of gallium arsenide.

8. A transistor according to claim 6 wherein said buffer layer is made of a compound having the formula $Ga_{1-x}Al_xAs$.

9. A transistor according to claim 8 wherein said substrate is made of gallium arsenide.

* * * * *